(12) United States Patent
Hunt et al.

(10) Patent No.: US 9,750,126 B2
(45) Date of Patent: Aug. 29, 2017

(54) ELECTRONIC DEVICE WITH COMBINATION HEAT SINK/BLOWER OR FAN ASSEMBLY HAVING AIR DUCT

(71) Applicant: THOMSON LICENSING, Issy de Moulineaux (FR)

(72) Inventors: Mickey Jay Hunt, Camby, IN (US); Randy Wayne Craig, Fishers, IN (US); Christopher Michael William Proctor, Westfield, IN (US)

(73) Assignee: Thomson Licensing, Issy-les-Moulineaux (FR)

( * ) Notice: Subject to any disclaimer, the term of this patent is extended or adjusted under 35 U.S.C. 154(b) by 21 days.

(21) Appl. No.: 14/437,550

(22) PCT Filed: Oct. 22, 2013

(86) PCT No.: PCT/US2013/066018
§ 371 (c)(1),
(2) Date: Apr. 22, 2015

(87) PCT Pub. No.: WO2014/066290
PCT Pub. Date: May 1, 2014

(65) Prior Publication Data
US 2015/0305137 A1    Oct. 22, 2015

Related U.S. Application Data

(60) Provisional application No. 61/716,640, filed on Oct. 22, 2012.

(51) Int. Cl.
*H05K 7/20* (2006.01)
*H05K 1/02* (2006.01)
(Continued)

(52) U.S. Cl.
CPC ............ *H05K 1/0203* (2013.01); *G06F 1/20* (2013.01); *H01L 23/4006* (2013.01);
(Continued)

(58) Field of Classification Search
CPC . G06F 1/181–1/182; H05K 7/20218–7/20381;
(Continued)

(56) References Cited

U.S. PATENT DOCUMENTS 5,597,034 A    1/1997 Barker, III et al.
5,917,697 A    6/1999 Wang
(Continued)

FOREIGN PATENT DOCUMENTS

JP    2002-368467 A    12/2002
JP    4234444 B2    12/2008
(Continued)

OTHER PUBLICATIONS

Search Report Dated: Jan. 24, 2014.

*Primary Examiner* — Anthony Haughton
*Assistant Examiner* — Razmeen Gafur
(74) *Attorney, Agent, or Firm* — Myers Wolin LLC

(57) ABSTRACT

An electronic device includes a circuit board having heat generating components thereon. A heat sink with air current generating electric device assembly lies over the circuit board, through which heat from the circuit board and the components thereon is dispersed. The assembly includes a heat sink having a solid central core and a plurality of fins protruding from the core. An air current generating electric device is disposed over the heat sink and having an air intake facing a top of the heat sink and an exhaust opening directed parallel to a plane of the circuit board. An air duct extends from the exhaust opening of the air current generating electric device to exhaust apertures on at least one side wall of the electronic device.

18 Claims, 14 Drawing Sheets

(51) Int. Cl.
*G06F 1/20* (2006.01)
*H01L 23/467* (2006.01)
*H01L 23/40* (2006.01)
*H01L 23/473* (2006.01)

(52) U.S. Cl.
CPC ....... *H01L 23/467* (2013.01); *H05K 7/20145* (2013.01); *H05K 7/20154* (2013.01); *H01L 2924/0002* (2013.01)

(58) Field of Classification Search
CPC .............. H05K 7/20409–7/20418; H05K 7/20009–7/202; H01L 23/367–23/3677; H01L 23/473; H01L 23/46–23/467
USPC ...... 361/676–678, 679.46–679.54, 688–723, 361/699–704, 709–710, 719–721; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | |
|---|---|---|
| 6,113,485 A | 9/2000 | Marquis et al. |
| 6,678,157 B1 | 1/2004 | Bestwick |
| 2002/0000308 A1* | 1/2002 | Miyahara ................. G06F 1/20 165/80.3 |
| 2002/0098792 A1* | 7/2002 | Hsiao ................. H05K 7/20172 454/184 |
| 2002/0186532 A1 | 12/2002 | Tomioka et al. |
| 2003/0136545 A1* | 7/2003 | Lin ........................... F28F 3/06 165/80.3 |
| 2005/0088821 A1 | 4/2005 | Lee et al. |
| 2005/0174738 A1* | 8/2005 | Lam ........................ H01L 23/36 361/704 |
| 2005/0243515 A1* | 11/2005 | Chin .................... F28F 13/003 361/697 |
| 2005/0248920 A1* | 11/2005 | Huang .................. F04D 29/703 361/696 |
| 2006/0092612 A1* | 5/2006 | Inoue ...................... G06F 1/203 361/700 |
| 2006/0174636 A1* | 8/2006 | Chen ..................... H01L 23/467 62/86 |
| 2008/0062646 A1* | 3/2008 | Foster, Sr. ............ H01L 23/467 361/697 |
| 2008/0112130 A1* | 5/2008 | Nakamura .............. G06F 1/203 361/679.49 |
| 2008/0158820 A1* | 7/2008 | Peng ...................... H01L 23/427 361/703 |
| 2008/0180912 A1* | 7/2008 | Yamaoka ................ B21C 23/08 361/697 |
| 2009/0161311 A1* | 6/2009 | Tseng ........................ G06F 1/20 361/679.47 |
| 2009/0225511 A1* | 9/2009 | Hsu ....................... H01L 23/467 361/697 |
| 2010/0025022 A1* | 2/2010 | Tien .......................... G06F 1/20 165/121 |
| 2010/0053884 A1* | 3/2010 | Hung ........................ G06F 1/20 361/679.47 |
| 2010/0220445 A1* | 9/2010 | Fujiwara ............... F04D 25/068 361/695 |
| 2011/0026223 A1* | 2/2011 | Kaneko ................... G06F 1/203 361/692 |
| 2011/0038120 A1* | 2/2011 | Merz ................. G02F 1/133308 361/679.47 |
| 2011/0056659 A1* | 3/2011 | Horng ................... H01L 23/467 165/104.26 |
| 2011/0079374 A1* | 4/2011 | Horng ....................... G06F 1/20 165/121 |
| 2011/0122576 A1* | 5/2011 | Kuo ........................ G06F 1/181 361/679.58 |
| 2011/0122584 A1* | 5/2011 | Hata ................... F28D 15/0233 361/700 |
| 2011/0279969 A1* | 11/2011 | Memon ..................... G06F 1/20 361/679.47 |
| 2011/0310559 A1* | 12/2011 | Horng ..................... F21V 29/2212 361/697 |
| 2012/0050991 A1 | 3/2012 | Tamanuki |
| 2012/0147546 A1 | 6/2012 | Chen et al. |

FOREIGN PATENT DOCUMENTS

| | | |
|---|---|---|
| JP | 2012-49315 A | 3/2012 |
| WO | 02/093643 A1 | 11/2002 |

* cited by examiner

ELECTRONIC DEVICE WITH COMBINATION HEAT SINK/BLOWER OR FAN ASSEMBLY HAVING AIR DUCT

CROSS-REFERENCE TO RELATED APPLICATIONS

This application claims the benefit under 35 U.S.C. §365 of International Application PCT/US2013/066018, filed Oct. 22, 2013, which was published in accordance with PCT Article 21(2) on May 1, 2014 in English and which claims the benefit of U.S. provisional patent application No. 61/716,640, filed Oct. 22, 2012.

TECHNICAL FIELD

The present principles relate generally to electronic devices and, more particularly, to an electronic device with a combination heat sink/blower or fan assembly having an air duct.

BACKGROUND

Consumer/market preference for set top boxes and the like (such as computers, game consoles, DVD players, CD player, etc.) is to have such devices be small/compact.

Also, there is a need in set top boxes and the like to have long term performance capabilities and a need for product versatility/high functionality. This product versatility/high functionality requirement implies that numerous components such as hard drives, smart cards, printed circuit boards, light sources for panel buttons and light pipes, panel jacks, fans/blowers, heat sinks, etc., need to be in the device. Long term performance generally implies that heat generated by such devices be effectively managed or dissipated to keep the device at safe operating temperatures.

With the small size preference and high functionality requirement, set top boxes and the like must be densely packed with internal components, which causes space to be at a premium.

In particular, hard drives take up substantial space and generate significant heat. Thus, a need exists to manage and remove the heat generated by hard drives while avoiding an increase in the need for more space in set top boxes and like.

SUMMARY

These and other drawbacks and disadvantages of the prior art are addressed by the present principles, which are directed to an electronic device with a combination heat sink/blower or fan assembly having an air duct.

According to an aspect of the present principles, there is provided an electronic device. The electronic device includes a circuit board having heat generating components thereon. The electronic device further includes a heat sink with an air current generating electric device assembly, disposed over the circuit board, through which heat from the circuit board and the components thereon is released or dispersed. The heat sink with air current generating electric device assembly includes a heat sink having a solid central core and a plurality of fins protruding from the core. The heat sink with air current generating electric device assembly further includes an air current generating electric device disposed over the heat sink and having an air intake facing a top of the heat sink and an exhaust opening directed parallel to a plane of the circuit board. The heat sink with air current generating electric device assembly also includes an air duct having a channel that extends from the exhaust opening of the air current generating electric device to exhaust apertures on at least one side wall of the electronic device.

According to another aspect of the present principles, there is provided an electronic device. The electronic device includes a cover, side walls perpendicular to the cover, a bottom frame parallel to the cover, and a circuit board having heat generating components thereon. The electronic device further includes a heat sink with air current generating electric device assembly, disposed over the circuit board, through which heat from the circuit board and the components thereon is released or dispersed. The heat sink with air current generating electric device assembly has an air duct with a channel that extends from an exhaust opening of the heat sink with air current generating electric device assembly to exhaust apertures on at least one of the side walls to exhaust heated air out of the device.

These and other aspects, features and advantages of the present principles will become apparent from the following detailed description of exemplary embodiments, which is to be read in connection with the accompanying drawings.

BRIEF DESCRIPTION OF THE DRAWINGS

The present principles may be better understood in accordance with the following exemplary figures, in which.

DETAILED DESCRIPTION

The present principles are directed to an electronic device with a combination heat sink/blower or fan assembly having an air duct.

The present description illustrates the present principles. It will thus be appreciated that those skilled in the art will be able to devise various arrangements that, although not explicitly described or shown herein, embody the present principles and are included within its spirit and scope.

All examples and conditional language recited herein are intended for pedagogical purposes to aid the reader in understanding the present principles and the concepts contributed by the inventors to furthering the art, and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

A first embodiment of the present principles will be described with respect to FIG. 1, which is directed to an electronic device with a heat sink/blower or fan assembly. It is to be appreciated that the while a heat sink with blower or fan may be used in accordance with various embodiments of the present principles, the term "air current generating electric device" is interchangeably used to refer to any of a fan or a blower.

Figure 1:
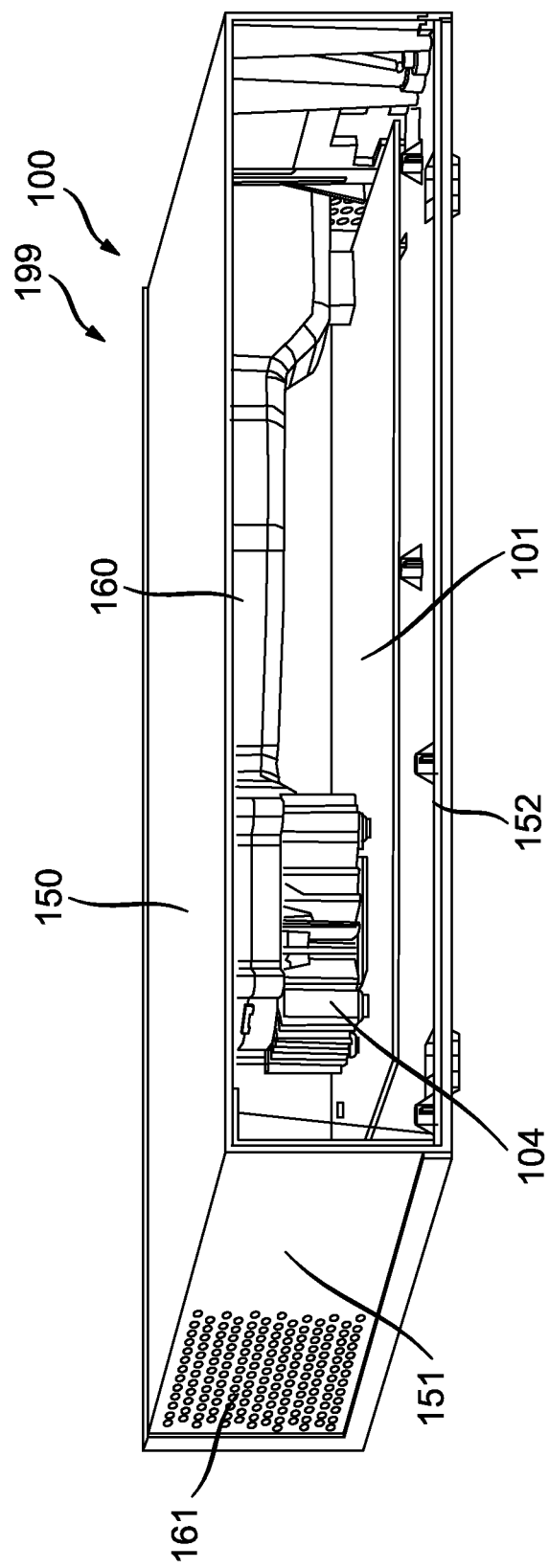
FIG. 1 shows a perspective view 199 of an electronic device 100, in accordance with an embodiment of the present principles.

FIG. 1 shows a perspective view 199 of an electronic device 100, in accordance with an embodiment of the present principles. The electronic device 100 can be, for example, but is not limited to, a set top box, a hard drive, a DVD player, and so forth. These and other embodiments of an electronic device to which the present principles can be applied are readily determined by one of ordinary skill in the art, given the teachings of the present principles provided herein, while maintaining the spirit of the present principles.

The electronic device 100 can include a printed circuit board (PCB) 101, a heat sink with blower or fan assembly (hereinafter "heat sink with blower assembly" for the sake of brevity) 104, a cover 150, side walls 151, a bottom frame 152, and an air duct 160. The PCB 101 can include heat-generating components. The heat sink with blower assembly 104 can be located on the PCB 101 or on a heat-generating component of the electronic device (e.g., a component on the PCB 101, a power supply, and so forth). The side walls 151 are perpendicular to the cover 150. The bottom frame 152 is parallel to the cover 150. The heat sink with blower assembly 104 can be located over the circuit board (through which heat from, e.g., a hard drive (or other heat-generating device) can be released or dispersed. The heat sink with blower assembly 104 includes the air duct 160. The air duct 160 has a channel that extends from the exhaust opening of the heat sink with blower assembly 104 to exhaust apertures 161 on the side wall 151 to exhaust heated air out of the device.

The electronic device 100 is depicted in FIG. 1 with is a front panel (not shown) removed to illustrate the heat sink with blower assembly 104. It is to be appreciated that while not shown, other components such as, but not limited to, smart card sockets, lighting components, receiver components, hard drives, and so forth can be included in electronic device 100.

Figure 2:
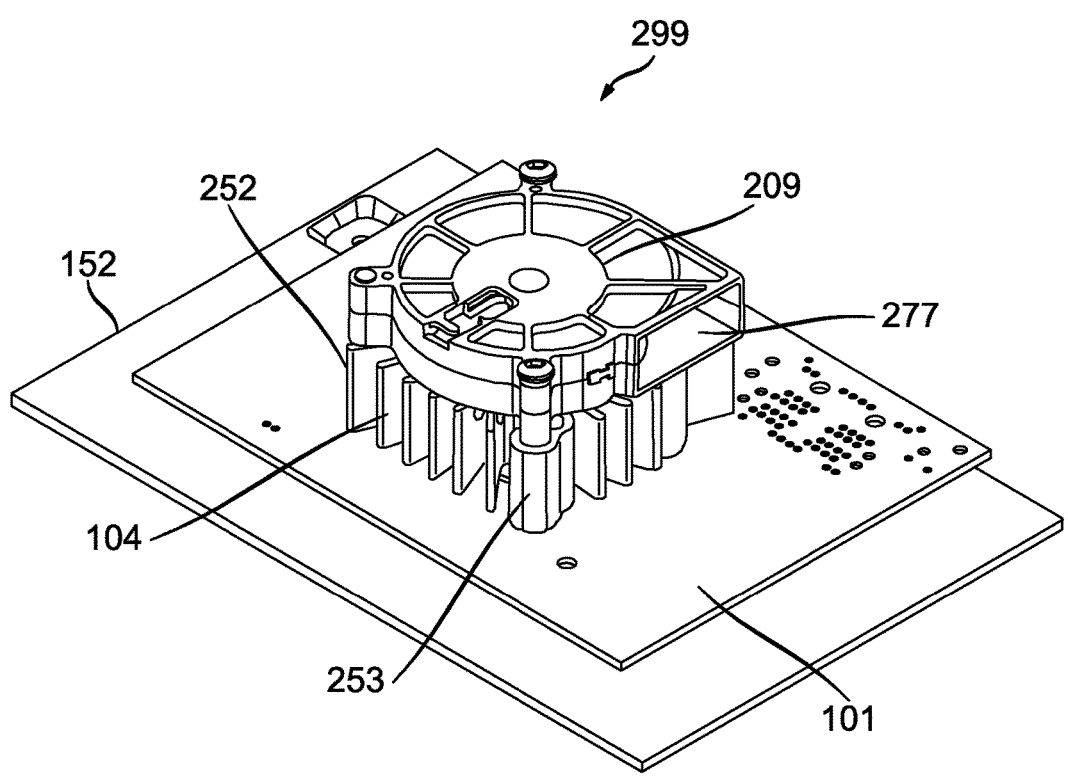
FIG. 2 shows a perspective view 299 of the heat sink with blower assembly 104, in accordance with an embodiment of the present principles.

FIG. 2 shows a perspective view 299 of the heat sink with blower assembly 104, in accordance with an embodiment of the present principles. The heat sink with blower assembly 104 includes: a heat sink 253 having a solid central core (see FIGS. 4 and 5) and a plurality of fins 252 protruding from the core; and a blower or fan 209 over the heat sink 253. The air intake of the heat sink with blower assembly 104 faces the top of the heat sink 253 (that is, air is drawn upward through the heat sink and towards the blower or fan 209). The exhaust of the blower or fan 209 is directed horizontally (i.e., parallel to the plane of the circuit board) through an exhaust opening 277.

Figure 3:
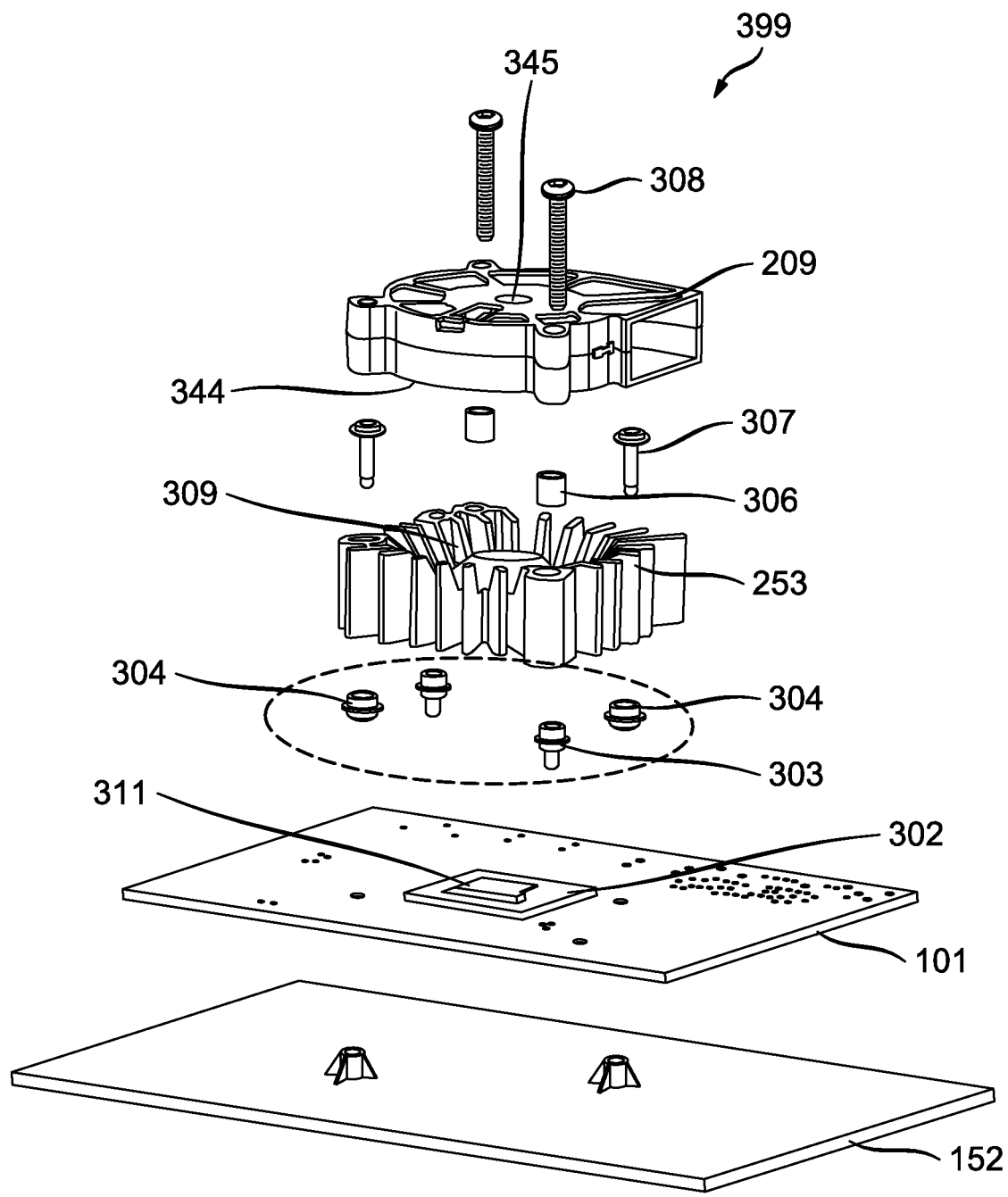
FIG. 3 shows an exploded view 399 of the heat sink with blower assembly in a disassembled state, in accordance with an embodiment of the present principles.

FIG. 3 shows an exploded view 399 of the heat sink with blower assembly 104 in a disassembled state, in accordance with an embodiment of the present principles. In particular, FIG. 3 shows how elements of the electronic device 100 such as, for example, the heat sink 253 and the blower or fan 209, are integrated with the PCB 101. The heat sink with blower assembly 104 includes the bottom frame 152, a main PCB 101, a main integrated circuit (IC) 302, a locator pin insert 303, a standoff insert 304, an extruded heat sink 253, a threaded insert 306, a screw 307 for the heat sink 253, the blower or fan 209, and a screw 308 for the blower or fan 209.

The heat sink 253 can have a concave pocket 309 facing a mounting surface of the blower or fan 209. The main IC 302 can have a thermal pad 311 disposed thereon. The standoff insert 304 between the PCB 101 and the heat sink 253 can keep the heat sink from rattling and keep the heat sink spaced from the PCB 101. A mounting surface 344 of the blower or fan 209 is opposite a top surface 345 of the blower or fan 209.

Figure 4:
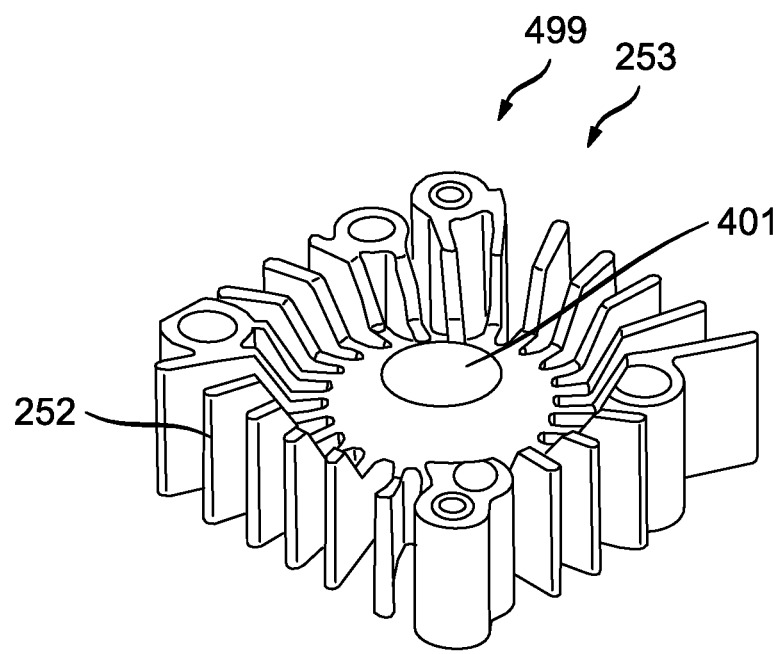
FIG. 4 shows a perspective view 499 of the heat sink 253 alone that will sit over the printed circuit board (PCB) 101, in accordance with an embodiment of the present principles.
Figure 5:
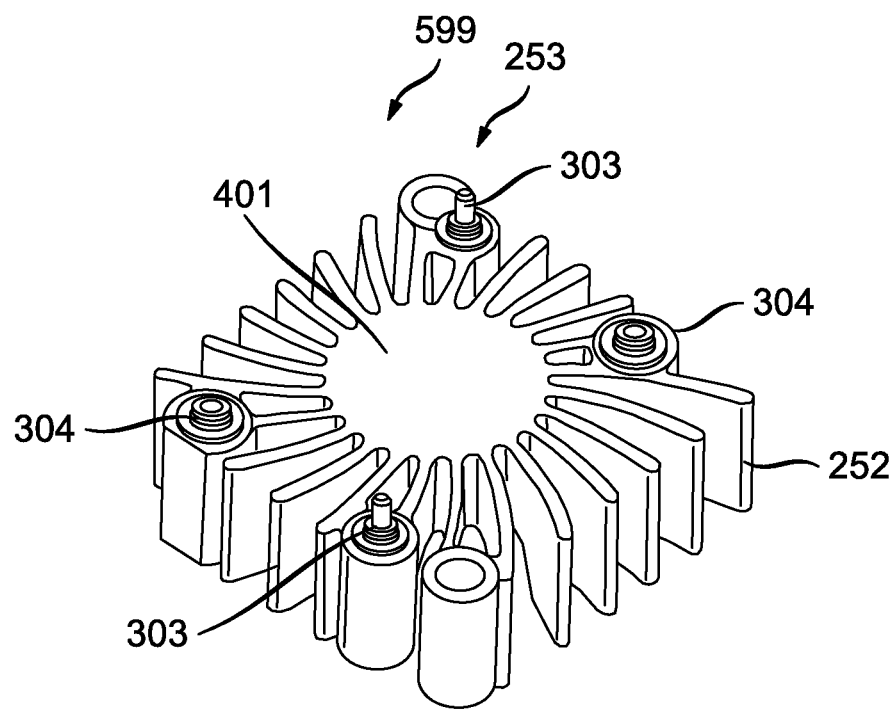
FIG. 5 shows another perspective view 599 of the heat sink 253 alone that will sit over the PCB 101, in accordance with an embodiment of the present principles.
Figure 8:
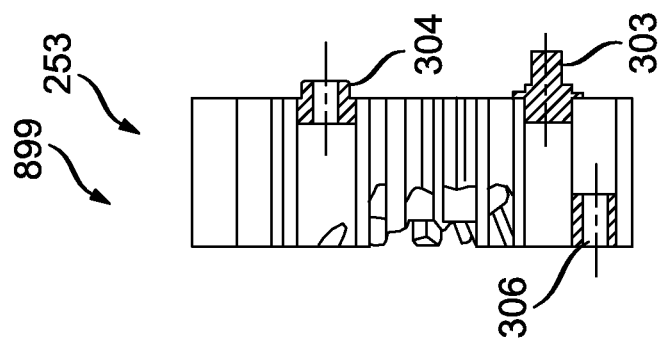
FIG. 8 shows a cross-sectional view 899 of the heat sink 253 along line B-B, in accordance with an embodiment of the present principles.
Figure 7:
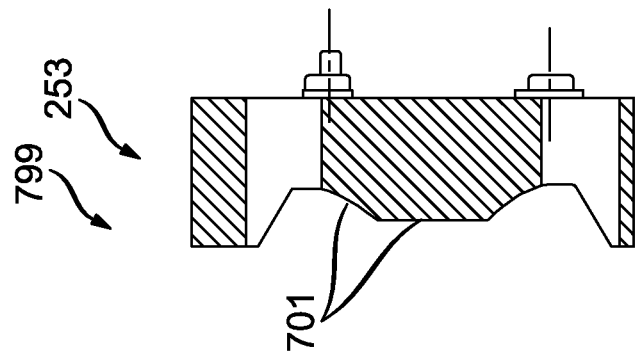
FIG. 7 shows a cross-sectional view 799 of the heat sink 253 along line A-A, in accordance with an embodiment of the present principles.
Figure 6:
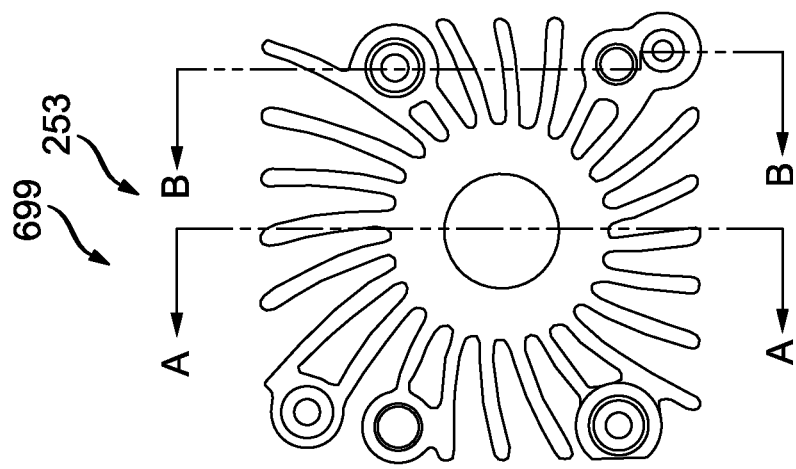
FIG. 6 shows a plan view 699 indicating cross-sections A-A and B-B of the heat sink 253 alone that will sit over the PCB 101, in accordance with an embodiment of the present principles.

FIG. 4 shows a perspective view 499 of the heat sink 253 alone that will sit over the PCB 101, in accordance with an embodiment of the present principles. FIG. 5 shows another perspective view 599 of the heat sink 253 alone that will sit over the PCB 101, in accordance with an embodiment of the present principles. FIG. 6 shows a plan view 699 indicating cross-sections A-A and B-B of the heat sink 253 alone that will sit over the PCB 101, in accordance with an embodiment of the present principles. FIG. 7 shows a cross-sectional view 799 of the heat sink 253 along line A-A, in accordance with an embodiment of the present principles. FIG. 8 shows a cross-sectional view 899 of the heat sink 253 along line B-B, in accordance with an embodiment of the present principles.

Regarding FIGS. 4 and 5, a solid central core 401 is generally cylindrical and vertically standing. The fins 252 can include a plurality of peripheral fins generally being flat and extending outward from the central core 401.

Regarding FIGS. 6-8, the heat sink 253 includes a machined air inlet area profile 701. In an embodiment, the threaded insert 306 can be press fit into the heat sink 253. In an embodiment, the standoff insert 304 can be press fit into the heat sink 253.

Figure 9:
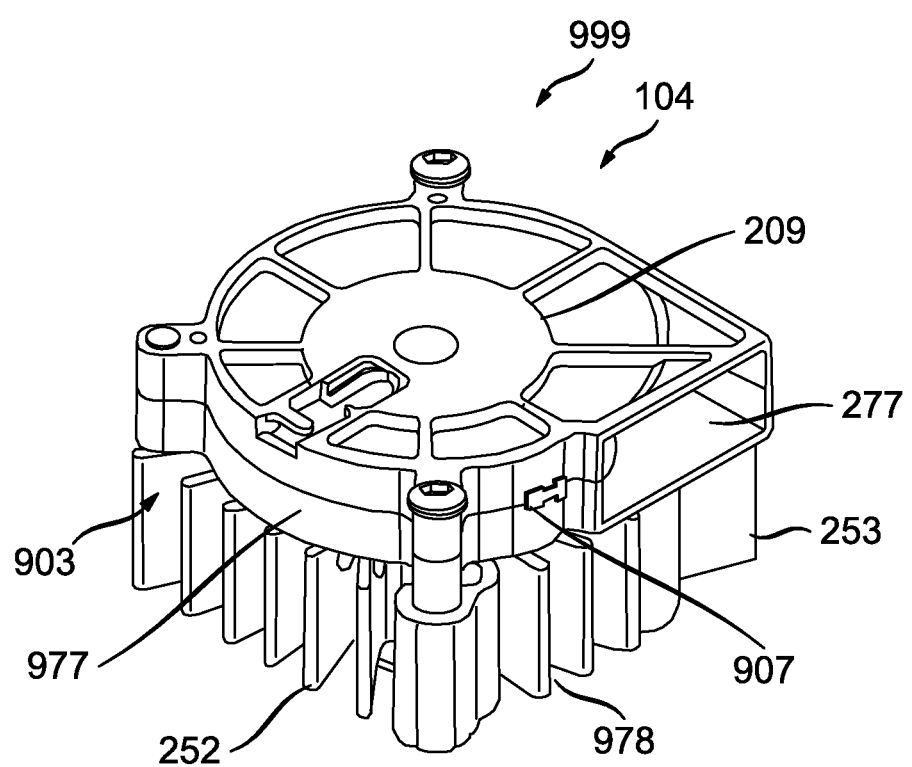
FIG. 9 shows a perspective view 999 of the heat sink with blower assembly 104, in accordance with an embodiment of the present principles.
Figure 10:
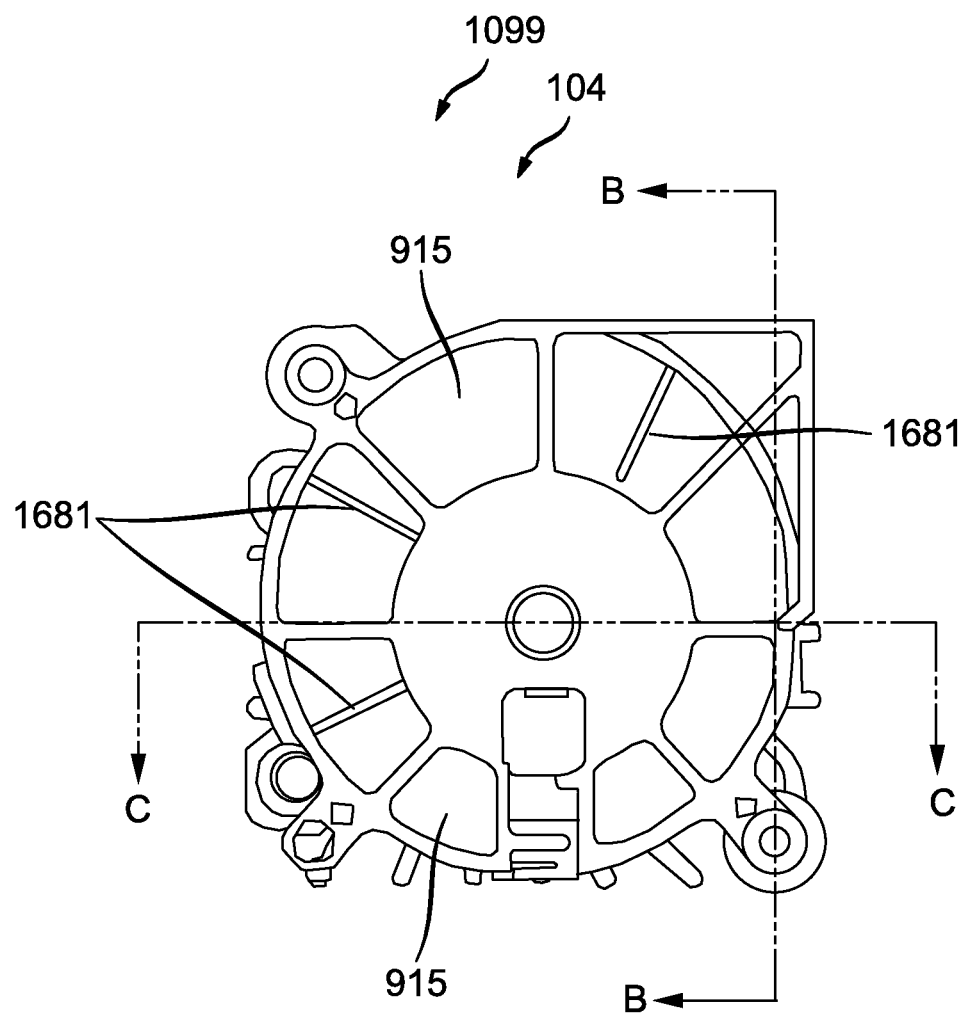
FIG. 10 shows a plan view 1099 indicating cross-sections B-B and C-C of the heat sink with blower assembly 104, in accordance with an embodiment of the present principles.
Figure 12:
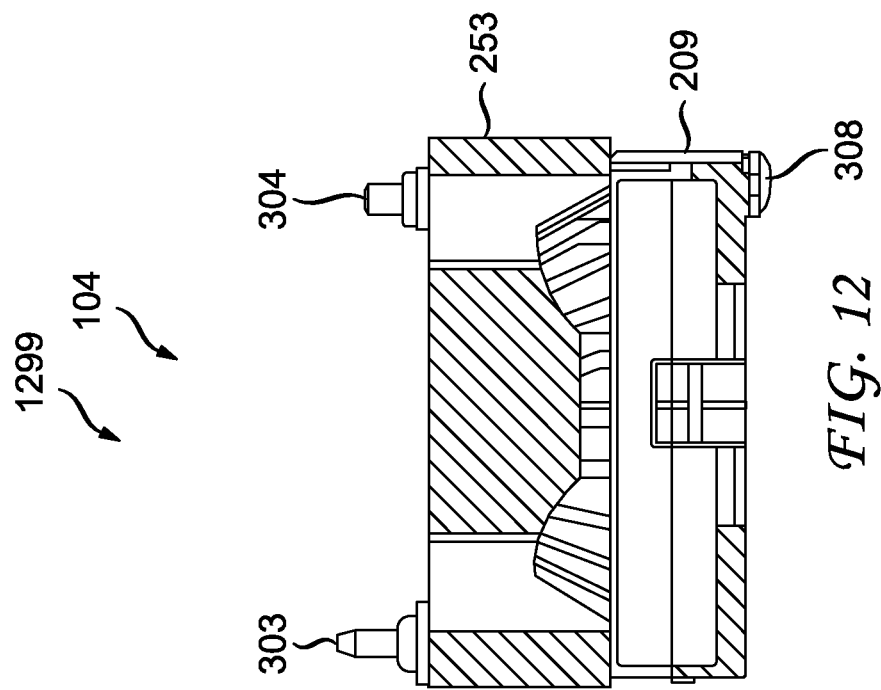
FIG. 12 shows a cross-sectional view 1299 of the heat sink with blower assembly 104 along line C-C, in accordance with an embodiment of the present principles.
Figure 11:
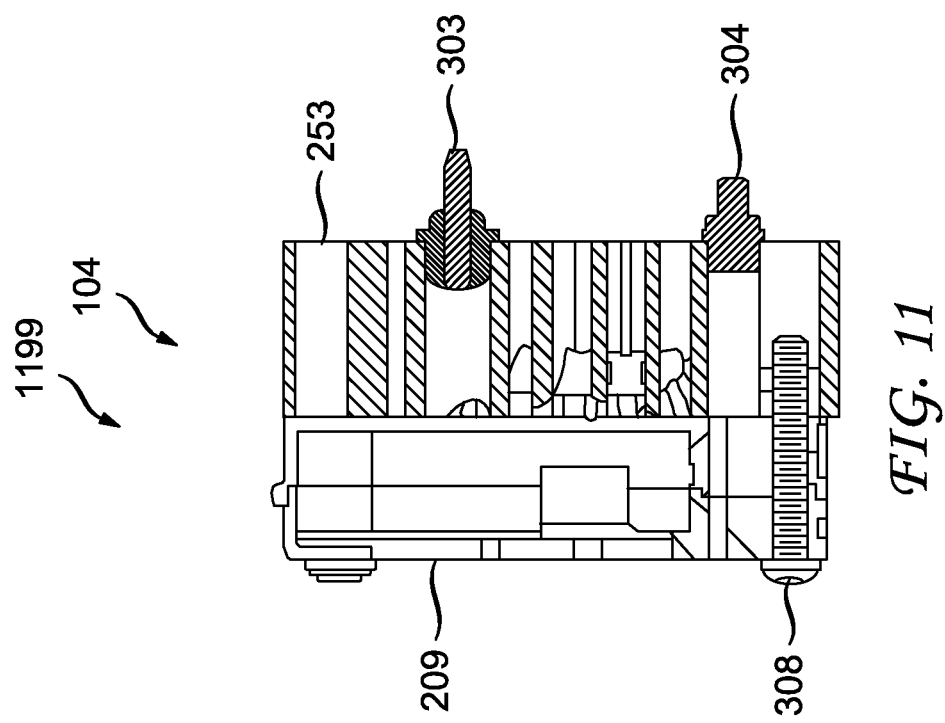
FIG. 11 shows a cross-sectional view 1199 of the heat sink with blower assembly 104 along line B-B, in accordance with an embodiment of the present principles.

FIG. 9 shows a perspective view 999 of the heat sink with blower assembly 104, in accordance with an embodiment of the present principles. FIG. 10 shows a plan view 1099 indicating cross-sections B-B and C-C of the heat sink with blower assembly 104, in accordance with an embodiment of the present principles. FIG. 11 shows a cross-sectional view 1199 of the heat sink with blower assembly 104 along line B-B, in accordance with an embodiment of the present principles. FIG. 12 shows a cross-sectional view 1299 of the heat sink with blower assembly 104 along line C-C, in accordance with an embodiment of the present principles.

The heat sink 253 has a periphery 978 that substantially follows a periphery 977 of the blower or fan 209. The blower or fan 209 is intended to be an implementation in which the blades of the rotating device are vertical (for a blower that focuses on pushing air horizontally out of the exhaust 277 on an air duct mounting side 907) or tilted from vertical (for a fan that forces air both horizontally and upward so that there can be openings 915 in the top of the fan to permit air out through the top also). The blower or fan 209 is intended to draw air in through the openings 915 on the mounting side 903 of the fan 209 (which can also extend through the heat sink 253 to a side opposite a mounting side of the blower or fan as shown). This forces air up through the fins 252 of the heat sink 253.

Figure 13:
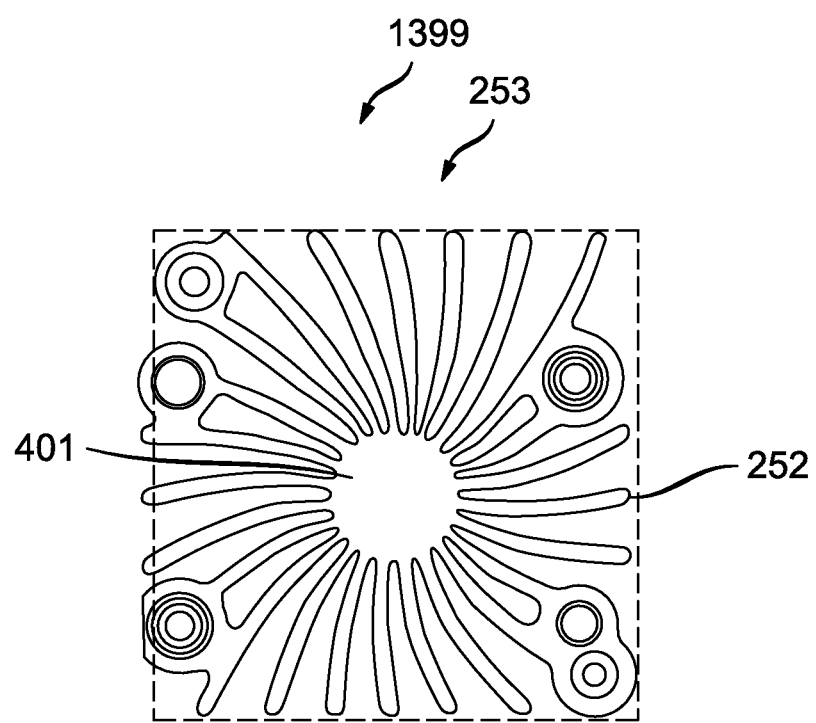
FIG. 13 shows a plan view 1399 of the heat sink 253 alone that will sit over the PCB 101, in accordance with an embodiment of the present principles.
Figure 14:
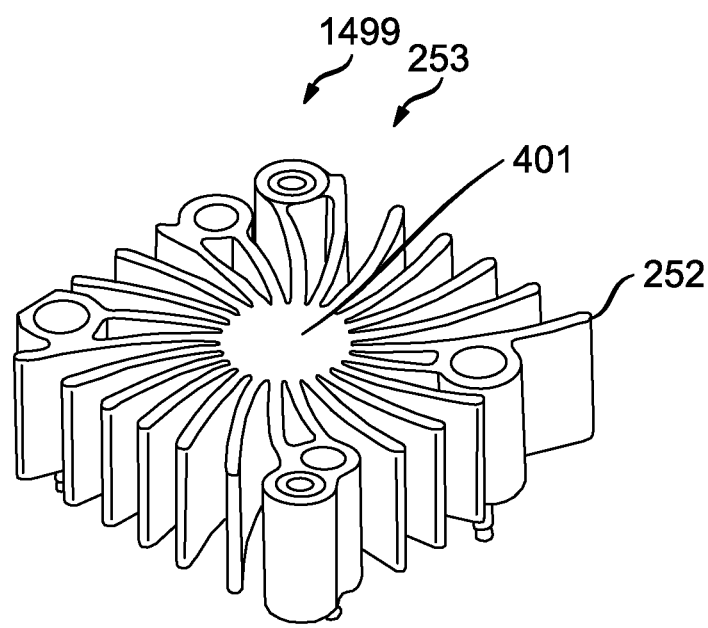
FIG. 14 shows a perspective view 1499 of the heat sink 253 alone that will sit over the PCB 101, in accordance with an embodiment of the present principles.
Figure 15:
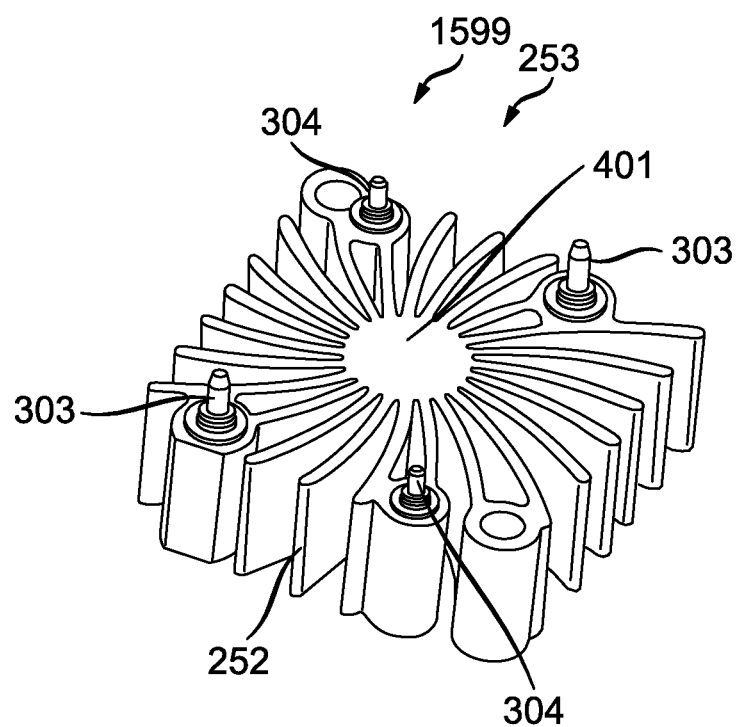
FIG. 15 shows another perspective view 1599 of the heat sink 253 alone that will sit over the PCB 101, in accordance with an embodiment of the present principles.

FIG. 13 shows a plan view 1399 of the heat sink 253 alone that will sit over the PCB 101, in accordance with an embodiment of the present principles. FIG. 14 shows a perspective view 1499 of the heat sink 253 alone that will sit over the PCB 101, in accordance with an embodiment of the present principles. FIG. 15 shows another perspective view 1599 of the heat sink 253 alone that will sit over the PCB 101, in accordance with an embodiment of the present principles.

Regarding FIGS. 13-15, the fins 252 can be generally flat and stand vertically and extend outward from the central core 401. There can be a number of fins 252 to promote thermal emissivity and promote air flow. The heat sink 253 can match the plan view profile of the blower or fan 209 and can be rectangular. The center diameter of the core 401 can be reduced to allow more air inlet. For example, the core 401 can take up less than 20 percent of the plan view surface area. Of course, other shapes and percentages can also be used in accordance with the teachings of the present principles, while maintain the spirit of the present principles.

Figure 16:
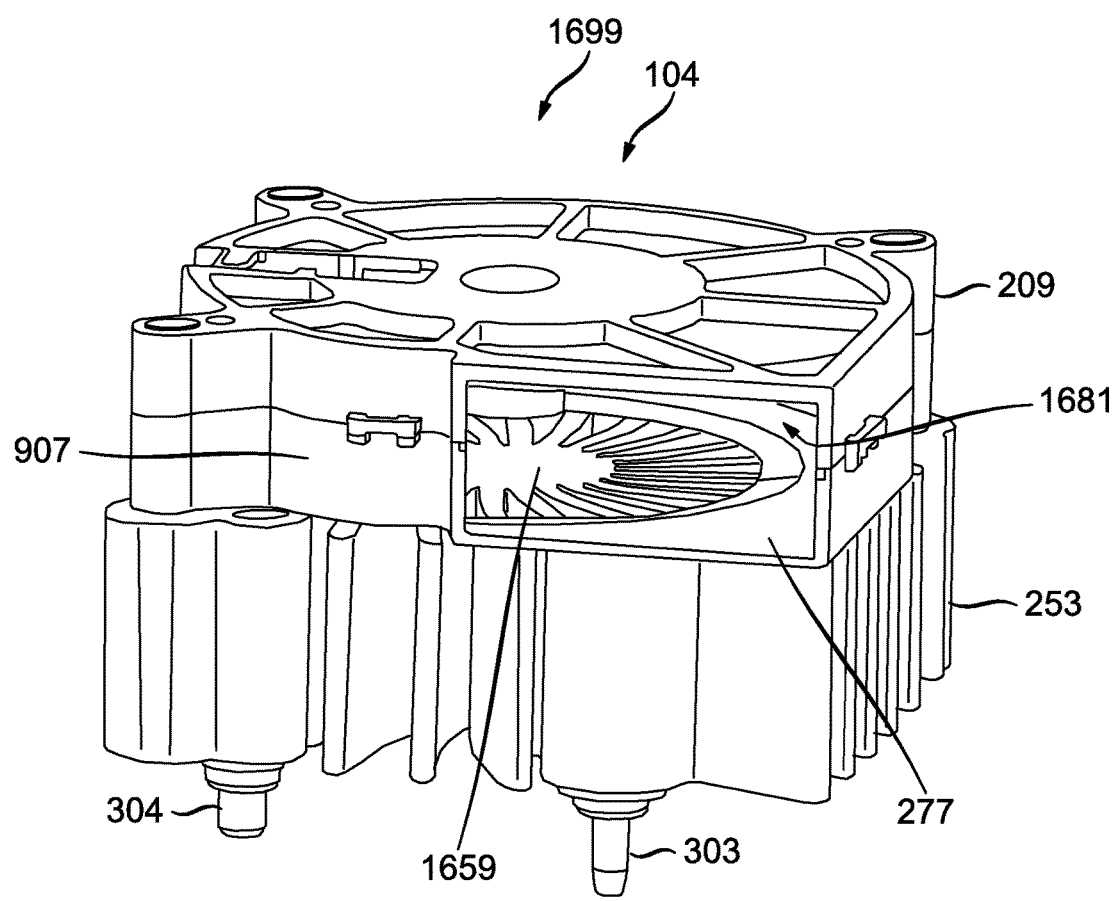
FIG. 16 shows a perspective view 1699 of the heat sink with blower assembly 104 without the air duct 1760 attached on the air duct mounting side 907, in accordance with an embodiment of the present principles.

FIG. 16 shows a perspective view 1699 of the heat sink with blower assembly 104 without the air duct 1760 (shown in FIGS. 17-8) attached on the air duct mounting side 907, in accordance with an embodiment of the present principles. The heat sink 253 can be an extrusion with press-in inserts 306 (see FIG. 3) and no machining to reduce cost. The center diameter 1659 of the blower or fan 209 (the core 401) can be reduced to allow more air through the blower or fan 209. The blades 1681 of the blower or fan 209 can blow air out though the exhaust opening 277.

Figure 17:
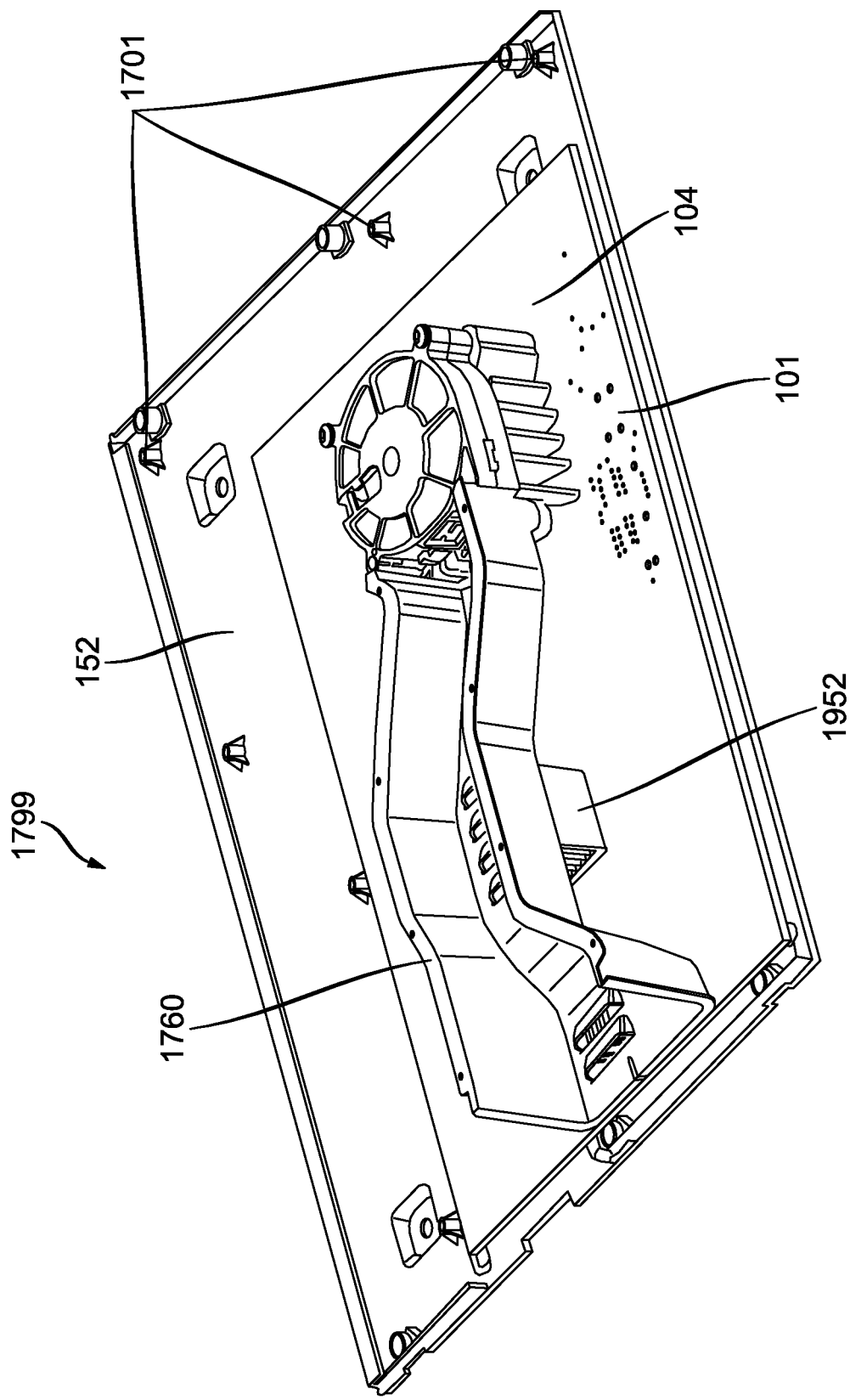
FIG. 17 shows a perspective view 1799 of the heat sink with blower assembly 104 on the PCB 101 with the air duct 1760 mounted on the air duct mounting side 907, in accordance with an embodiment of the present principles.

FIG. 17 shows a perspective view 1799 of the heat sink with blower assembly 104 on the PCB 101 with the air duct 1760 mounted on the air duct mounting side 907, in accordance with an embodiment of the present principles. The air duct 1760 can be curved to dampen noise from the blower or fan 209 as it forces air out of the electronic device 100. The bottom frame 152 can include various attachment points 1701 for attaching other elements of the electronic device 100 thereto.

Figure 18:
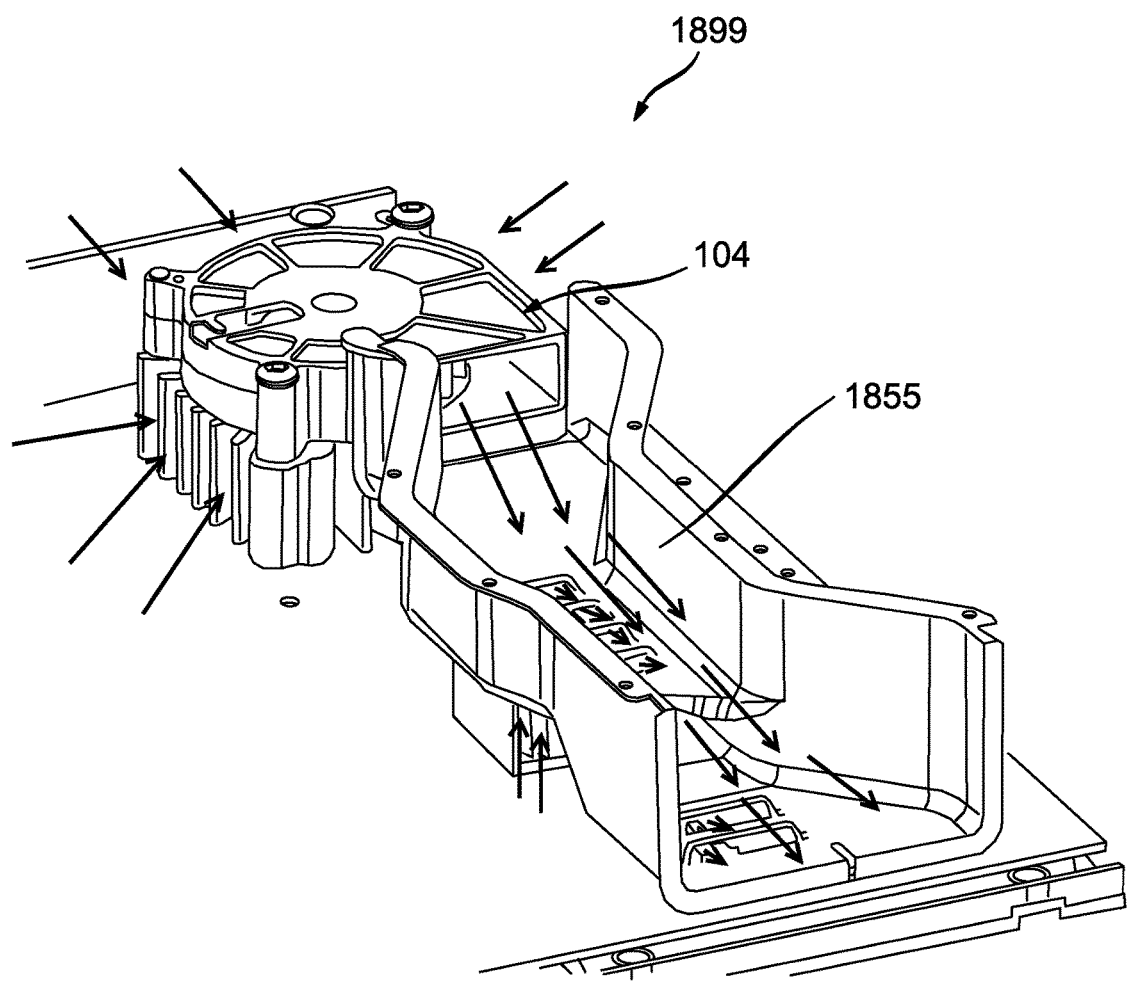
FIG. 18 shows a perspective view 1899 of the heat sink with blower assembly 104 that depicts the air flow through the air duct 1760, in accordance with an embodiment of the present principles.

FIG. 18 shows a perspective view 1899 of the heat sink with blower assembly 104 that depicts the air flow through the air duct 1760, in accordance with an embodiment of the present principles. In particular, the various arrows (without reference numerals) shown in FIG. 18 depict the air flow through the air duct 1760 including through a channel 1855 thereof. In FIG. 18, the electronic device 100 is shown without the cover 150 for the sake of illustration.

Figure 19:
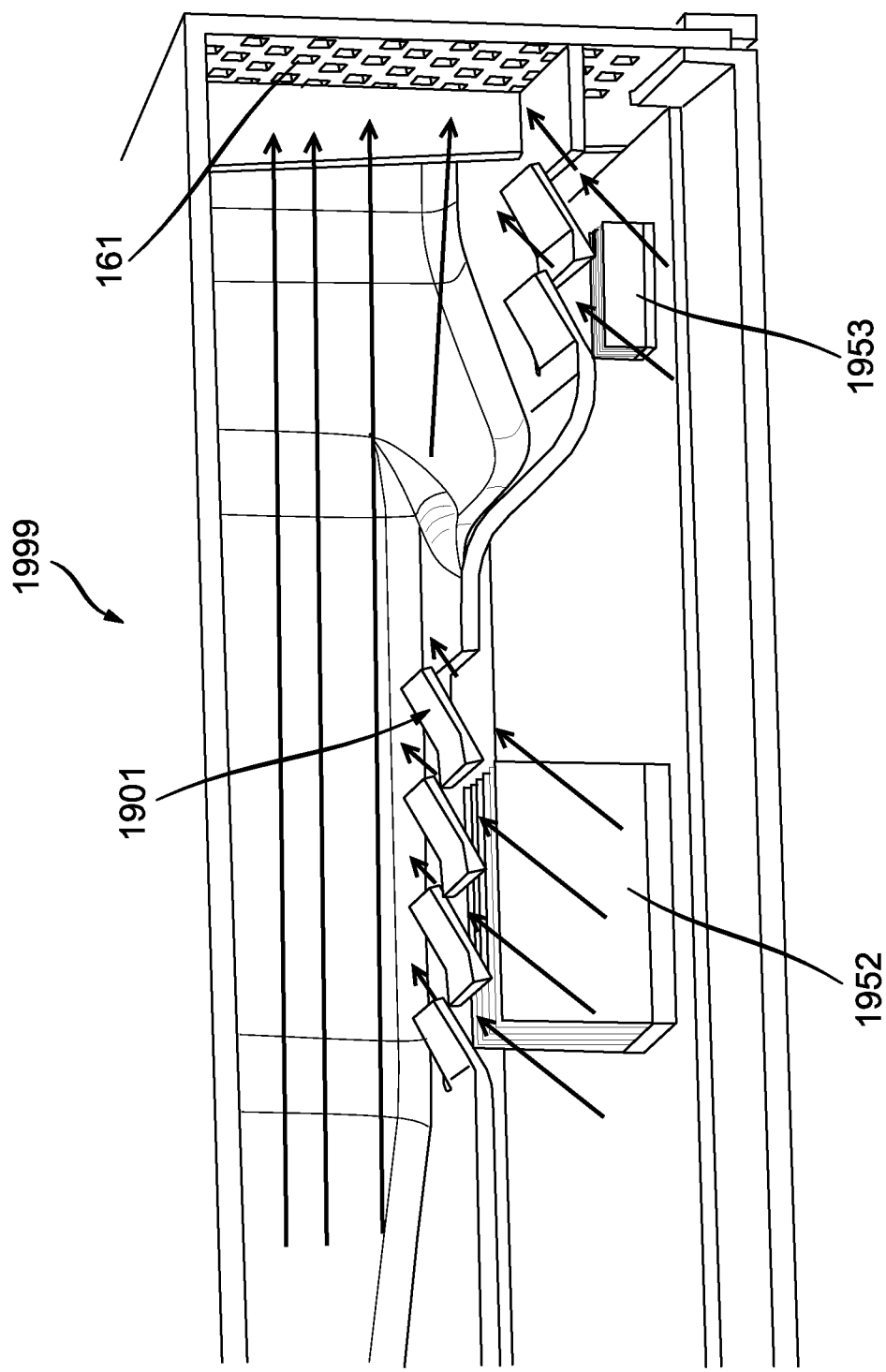
FIG. 19 shows a perspective interior view 1999 of the heat sink with blower assembly 104 that depicts the air flow through the air duct 1760 and out of the electronic device 100 through exhaust apertures 1951 on the side wall 151, in accordance with an embodiment of the present principles.

FIG. 19 shows a perspective interior view 1999 of the heat sink with blower assembly 104 that depicts the air flow through the air duct 1760 and out of the electronic device 100 through exhaust apertures 161 on the side wall 151, in accordance with an embodiment of the present principles. The air duct 1760 can have fins or louvers 1901 such that air passing over the fins or louvers 1901 will draw air up through the heat sinks 1952 and 1953. A sidewall of the air duct 1760 is not shown to allow the fins or louvers 1901 to be seen. It is to be appreciated that heat sinks 1952 and 1953 can be implemented without a blow or fan 209 mounted thereon, in contrast to heat sink 253.

Although the illustrative embodiments have been described herein with reference to the accompanying drawings, it is to be understood that the present principles are not limited to those precise embodiments, and that various changes and modifications may be effected therein by one of ordinary skill in the pertinent art without departing from the scope or spirit of the present principles. All such changes and modifications are intended to be included within the scope of the present principles as set forth in the appended claims.

The invention claimed is:

1. An electronic device, comprising:
a heat sink with air current generating electric device assembly, disposed over a circuit board within the electronic device having heat-generating components thereon, the heat sink with air current generating electric device assembly dispersing heat from the components on the circuit board;
wherein the heat sink with air current generating electric device assembly includes:
a heat sink;
an air current generating electric device disposed over the heat sink and having an air intake facing a top of the heat sink and an exhaust opening directed parallel to a plane of the circuit board; and an air duct having a channel that extends from the exhaust opening of the air current generating electric device to at least one exhaust aperture on at least one side wall of the electronic device; and, at least one additional heat sink without an air current generating electric device, the at least one additional heat sink being disposed under or proximate to a bottom surface of the channel, and wherein the channel includes at least one of fins or louvers being configured to cause air being drawn up through the at least one additional heat sink when air flows through the channel from the air current generating electric device to the at least one exhaust aperture and over the at least one of fins or louvers.

2. The electronic device of claim 1, wherein the heat sink has a solid central core and a plurality of fins protruding from the core.

3. The electronic device of claim 1, wherein the heat sink has a concave pocket facing a mounting surface of the air current generating electric device.

4. The electronic device of claim 1, further comprising a standoff insert between the circuit board and the heat sink for keeping the heat sink from rattling and keeping the heat sink spaced away from the circuit board.

5. The electronic device of claim 2, wherein the air current generating electric device is a fan in which the blades thereof are tilted from vertical to force air horizontally across the circuit board and upward away from the circuit board.

6. The electronic device of claim 2, wherein the air current generating electric device is a blower in which the blades thereof are un-tilted and are vertically oriented to push air horizontally out of the exhaust opening and across the circuit board.

7. The electronic device of claim 1, wherein the heat sink is an extrusion with press fit inserts for attaching the heat sink at least one of to the circuit board or through the circuit board or around the circuit board to a bottom frame of the electrical device.

8. The electronic device of claim 1, wherein the air current generating electric device is a fan in which the blades thereof are tilted from vertical to force air upward away from the circuit board.

9. An electronic device with a circuit board having heat generating components thereon; comprising:

a heat sink with air current generating electric device assembly, disposed over the circuit board, through which heat from the circuit board and the components thereon is dispersed, and having an air duct with a channel that extends from an exhaust opening of the heat sink with air current generating electric device assembly to exhaust apertures on a side walls of the electronic device to exhaust heated air out of the device; and at least one additional heat sink without an air current generating electric device, the at least one additional heat sink being disposed under or proximate to a bottom surface of the channel, and wherein the channel includes at least one of fins or louvers that are configured to cause air being drawn up through the at least one additional heat sink when air flows through the channel from the air current generating electric device to the at least one exhaust aperture and over the at least one of fins or louvers.

10. The electronic device of claim 9, wherein the heat sink with air current generating electric device assembly further includes:

a heat sink having a solid central core and a plurality of fins protruding from the core; and an air current generating electric device disposed over the heat sink and having an air intake facing a top of the heat sink and the exhaust opening directed parallel to a plane of the circuit board, and further having a mounting surface and a top surface opposite the mounting surface, wherein the air intake is disposed on the mounting surface and the heat sink has a periphery that surrounds the top surface and the bottom surface and substantially follows a periphery of the air current generating electric device.

11. The electronic device of claim 10, wherein a plane in which blades of the air current generating electric device rotates is parallel to the mounting surface.

12. The electronic device of claim 10, wherein the heat sink has a concave pocket facing a mounting surface of the air current generating electric device.

13. The electronic device of claim 10, further comprising a standoff insert between the circuit board and the heat sink for keeping the heat sink from rattling and keeping the heat sink spaced away from the circuit board.

14. The electronic device of claim 10, wherein the air current generating electric device is a fan in which the blades thereof are tilted from vertical to force air horizontally across the circuit board and upward away from the circuit board.

15. The electronic device of claim 10, wherein the air current generating electric device is a blower in which the blades thereof are un-tilted and are vertically oriented to push air horizontally out of the exhaust opening and across the circuit board.

16. The electronic device of claim 11, wherein the heat sink is an extrusion with press fit inserts for attaching the heat sink at least one of to the circuit board or through the circuit board or around the circuit board to a bottom frame of the electrical device.

17. The electronic device of claim 10, wherein the air duct is curved to dampen operating noise from the air current generating electric device.

18. The electronic device of claim 10, wherein the air current generating electric device is a blower in which the blades thereof are un-tilted and are vertically oriented to push air horizontally out of the exhaust opening.

* * * * *